United States Patent [19]

Moloney et al.

[11] Patent Number: 5,408,436
[45] Date of Patent: Apr. 18, 1995

[54] CIRCUIT STRUCTURE HAVING DISTRIBUTED REGISTERS WITH SELF-TIMED READING AND WRITING OPERATIONS

[75] Inventors: David Moloney, Cornaredo; Gianfranco Vai, Pavia; Maurizio Zuffada; Giorgio Betti, both of Milan; Fabrizio Sacchi, Pavia, all of Italy

[73] Assignee: SGS-Thomson Micorelectronics S.r.l., Milan, Italy

[21] Appl. No.: 979,960

[22] Filed: Nov. 23, 1992

[30] Foreign Application Priority Data

Nov. 28, 1991 [IT] Italy ................. MI91A3187

[51] Int. Cl.$^6$ .................. G11C 7/00; G11C 8/00
[52] U.S. Cl. .................... 365/203; 365/210; 365/230.06; 365/194; 365/189.11
[58] Field of Search .............. 365/203, 230.06, 210, 365/194, 189.11, 189.12

[56] References Cited

U.S. PATENT DOCUMENTS

| | | | |
|---|---|---|---|
| 4,551,821 | 11/1985 | Yokouchi et al. | 365/203 |
| 4,829,475 | 5/1989 | Ward et al. | 365/78 |
| 5,029,135 | 7/1991 | Okubo | 365/203 |
| 5,062,082 | 10/1991 | Choi | 305/194 |
| 5,084,839 | 1/1992 | Young | 365/189.12 |

FOREIGN PATENT DOCUMENTS 0179993 9/1985 Japan ................. 365/203
2226721 11/1989 United Kingdom .

OTHER PUBLICATIONS

D. A. Kummer et al. Delayed I/O Read/Write Circuit IBM Technical Disclosure Bulletin vol. 26 No. 12 May 1984, pp. 6364 6365.
National Semiconductor Corporation, Santa Clara, Calif., "Logic Databook, vol. II", 1984, pp. 4-20-8-4-209.

Primary Examiner—Eugene R. LaRoche
Assistant Examiner—Huan Hoang
Attorney, Agent, or Firm—Seed & Berry

[57] ABSTRACT

The circuit structure comprises a series of storage units, a data bus, an address bus, a line for a reading/writing signal, a precharge logic suitable for precharging the address bus with a precharge address and a precharge sensor suitable for enabling the operation of address decoders of the storage units with a given delay with respect to the end of the precharge. The structure also comprises a flip-flop for controlling the address buses and the precharge logic as well as a delay circuit capable of producing a stop-writing signal with a delay calculated on the basis of the time necessary for the writing of a datum in a storage register of the storage units.

18 Claims, 3 Drawing Sheets

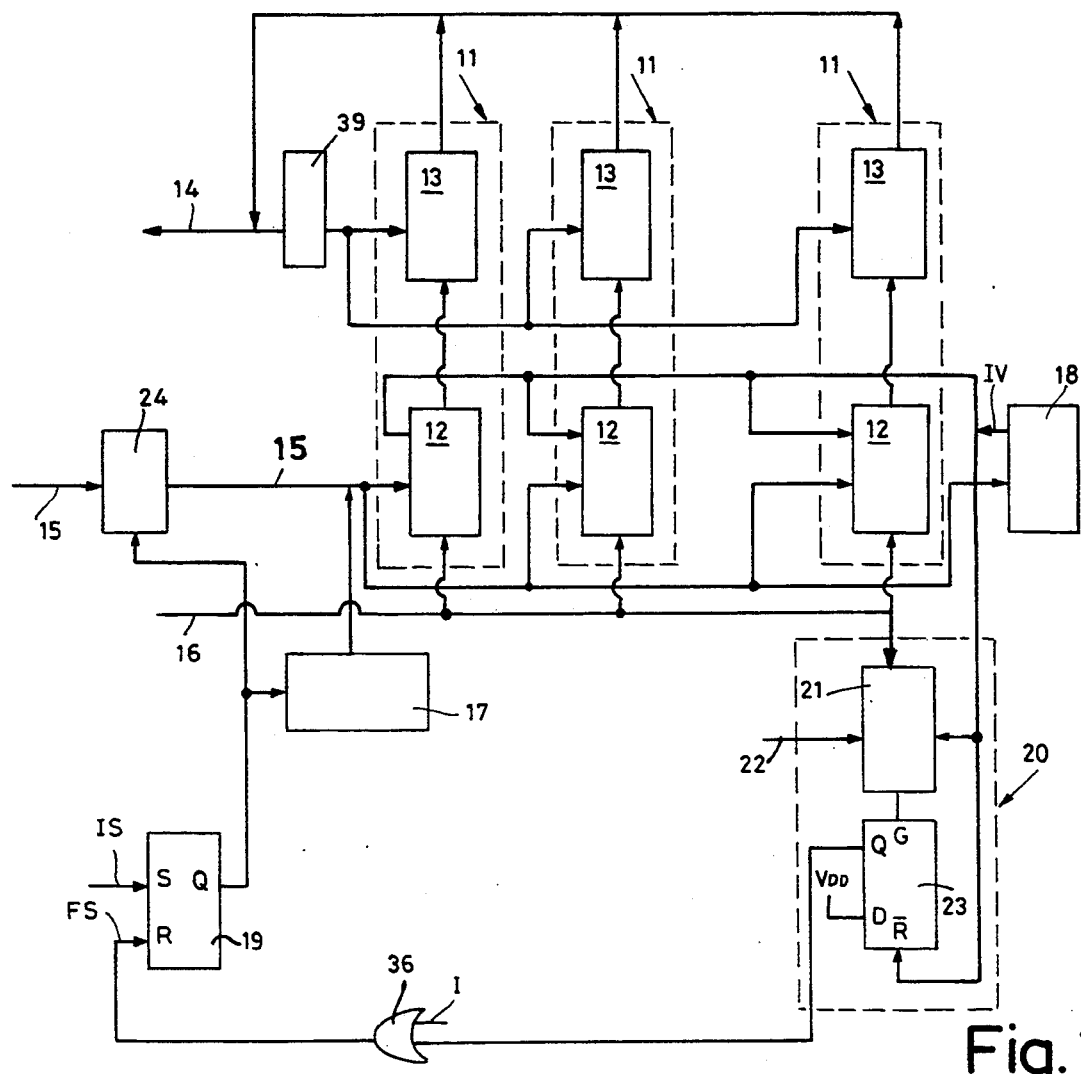
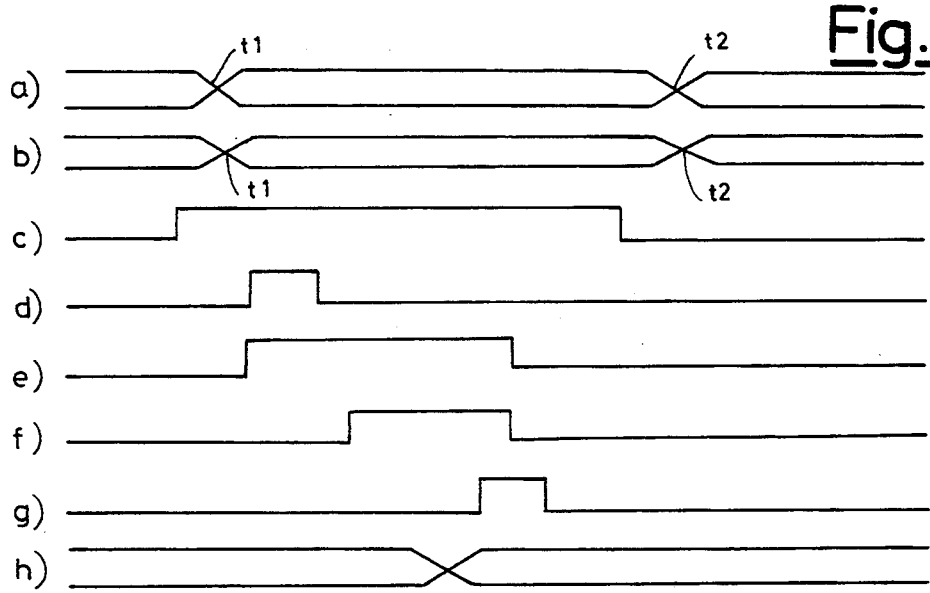
Fig. 1
Fig. 2

CIRCUIT STRUCTURE HAVING DISTRIBUTED REGISTERS WITH SELF-TIMED READING AND WRITING OPERATIONS

TECHNICAL FIELD

The present invention relates to a circuit structure having distributed registers with self-timed reading and writing operations.

BACKGROUND OF THE INVENTION

Electronic circuit systems are well known for their ability to rapidly transfer information. These systems are generally comprised of a series of data storage units, a data bus, an address bus, and a control line. The information contained on the address bus specifies which storage unit the circuitry should access to write or read the data. Whether the data is read or written is controlled by the voltage on the read/write control line, e.g., if a high voltage indicates a read operation, a low voltage would indicate a write operation. If the circuit is conducting a read operation, the circuitry reads the data from the addressed storage unit onto the data bus. On the other hand, if the circuit is conducting a write operation, the circuitry writes the data on the data bus into the addressed storage unit.

Typically, a storage unit consists of (1) a data register and (2) an address decoder. This type of architecture is highly efficient in transferring data, but in some circumstances, may introduce data errors. For example, if the circuit attempts to transfer information too rapidly, the circuit may read or write erroneous data. Erroneous data may be read or written if the circuitry attempts to write or read data before the address lines have properly stabilized. When this occurs, data may be written from or read to the wrong location. Errors of this type may be very serious, e.g., the circuitry may accidentally overwrite an important piece of data or use an incorrect value in a calculation.

One method of solving this problem is to reserve an address for use as a signal that the address on the address bus has stabilized. Reserving an address in this fashion obviously eliminates the number of addresses that can actually be used to address storage units, e.g., where the address bus is formed by n lines, only 2n−1 registers may be addressed. Generally, the address reserved will be either all "1s" or all "0s." The reserved address is commonly referred to as the precharge address.

When the circuitry drives precharge address onto the address line, the system is in a precharge state. When in this state, the circuitry does not allow the storage units to be read from or written to. To utilize the precharge addressing technique, the circuit must contain (1) a precharge logic capable of precharging the address bus to the precharge address and (2) a precharge sensor capable of checking for the precharge state on the address bus.

The precharge logic and the precharge sensor operate to eliminate address decoding errors by delaying all reading or writing until the address bus has had time to stabilize. The precharge sensor will only enable the address decoders once it senses that the precharge logic has released the address lines from the precharge state. Moreover, the sensor will only enable the decoders after a delay time greater than or equal to the address bus stabilization time. As a result, data is read or written only to the properly addressed register. It is important to arrange the precharge sensor at the extremity of the address bus so as to ensure maximum delay, so that the address is stable when the precharge sensor changes state.

A fundamental drawback to the architecture of the prior art is that it generally requires the use of master-slave flip-flops as registers in the storage units. The prior art required master-slave flip-flops because they transfer a datum only on the rising or falling edge of the switching impulse. By transferring datum only on the edges of a switching impulse, master-slave flip-flops ensure that data is not lost if the input datum changed while the switching impulse was active. However, master-slave flip-flops are larger in size and consume more power than gate-controlled single-stage flip-flops. As a result, they are not as economical as single-stage flip-flops.

Functionally, single-stage flip-flops differ from master-slave flip-flops by responding to changes in the state of an input datum whenever the switching impulse is active. Thus, if the datum changes before the end of the switching impulse, the flip-flop's output will change state and the original datum will be lost before being stored.

To overcome this problem, the prior art teaches the use of a specific suitably-timed switching or gating signal. The gating signal is obtained as the logic combination of the output of the precharge sensor with the clock signal that enables the datum switchings. A clock signal changes state roughly half-way through the time of duration of the datum. Therefore, the gating signal ends before the new datum switching operation begins. Because the gating signal controls the actual storing of the datum, the datum will not be lost even if the circuitry uses a single-step flip-flop.

The drawback of this solution is that it requires the use of an additional gating signal: A gating signal that may not be immediately available, and, in any event, increases the system's consumption of power.

Furthermore, designing proper timing of the gating signal requires a detailed knowledge of the behavior of the specific components of the system, e.g., bus delays, decoding delays, etc. The resulting circuitry is inelastic because it is dependent on the specific delay times of the particular components used. This serves as an extreme handicap to circuit designers. This handicap stems from production concern. Circuit manufacturers like to rely on obtaining similar components from two or more sources in order to remain flexible in what may be unpredictable business markets. However, components from different sources, although functionally similar, may have substantially different delay times. As a result, a designer must calculate the minimum length of the gating impulse based on the slowest possible combination of components. Consequently, the speed of the system is unduly hampered except when operating under the worst of all possible conditions.

SUMMARY OF THE INVENTION

The object of the present invention is to provide a circuit structure having distributed registers that guarantees maximum reliability in the operations for addressing the registers.

It is a further object of the invention to provide a circuit structure for data writing and reading data without requiring the use of master-slave flip-flops or auxiliary signals.

It is a further object of the invention to provide a circuit structure which provides for reliable transfer of data while improving the overall speed performance of the system.

The present embodiment of the invention is a circuit structure comprising (1) a series of storage units each including an address decoder and a datum storage register, (2) a data bus, (3) an address bus, (4) a control line for a reading/writing signal, (5) a precharge logic capable of precharging the address bus with a precharge address and (6) a precharge sensor suitable for enabling the operation of the address decoder.

The precharge sensor enables the address decoders only after a given delay with respect to the end of the precharged state. The system uses a flip-flop to control both the address bus and the precharge logic. The flip-flop is set by a start-writing signal and reset by a stop-writing signal. The delay circuit is indirectly activated by the start-writing signal via an enabling impulse from the precharge sensor. Once enabled, the delay circuit initiates a stop-writing signal which in turn sets the precharge logic to inhibit the addressing of the decoders. The delay circuit is preferably formed by a storage unit identical to the actual data storage units. By constructing the delay circuit in this manner, it produces a stop-writing signal after a delay calculated on the basis of the time necessary to write a datum to a storage registers. As a result, a write or read operation is enabled only for the time necessary to write or read the datum in the address register.

The following detailed description and associated illustrations will make the features of the present invention move evident.

BRIEF DESCRIPTION OF THE DRAWINGS

FIG. 1 illustrates a first embodiment of the circuit structure according to the invention.

FIG. 2 illustrates the timing of various signals in the circuit structure of FIG. 1 during a write operation.

DETAILED DESCRIPTION OF THE INVENTION

Figure 3:
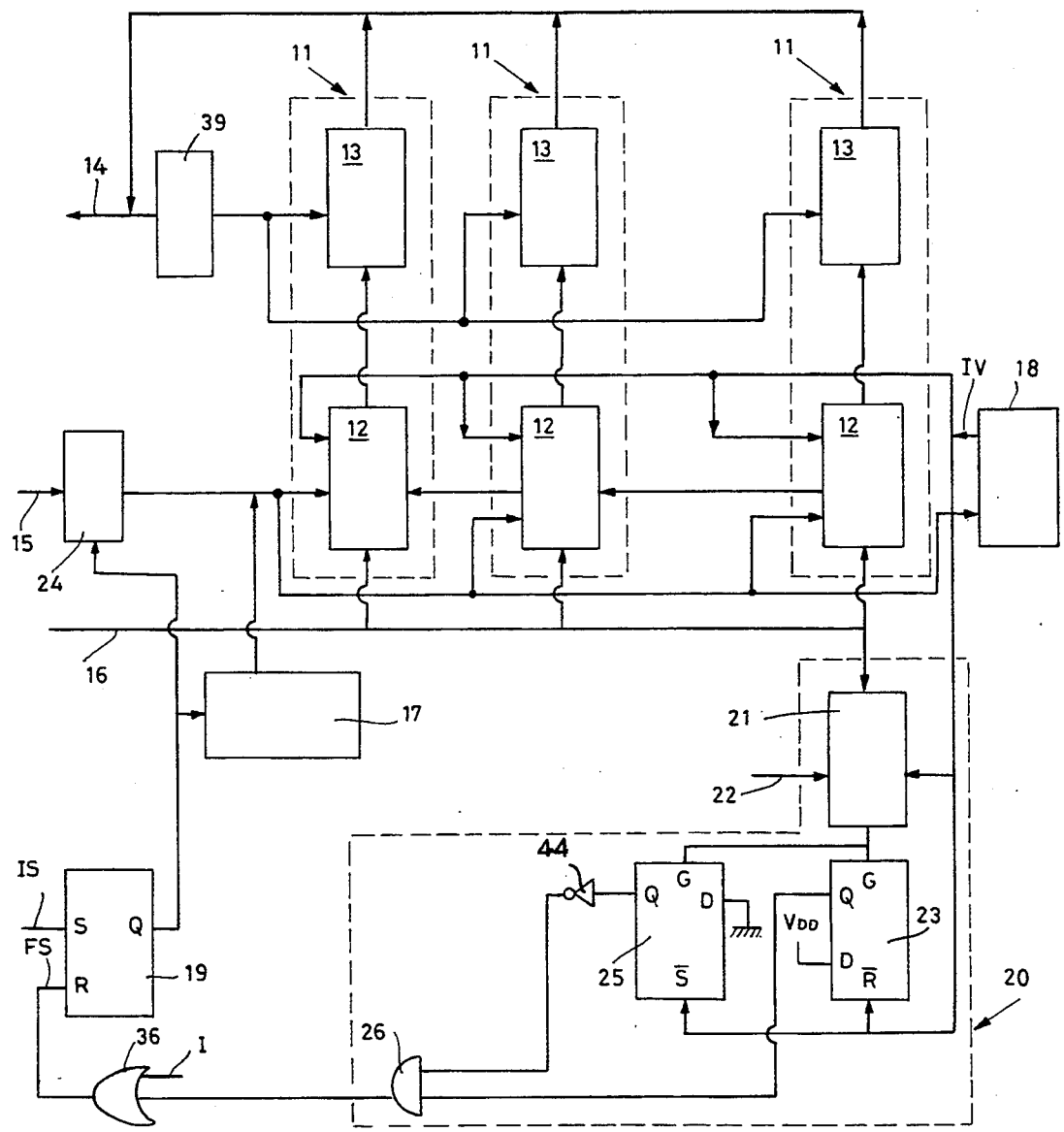
FIG. 3 illustrates a second embodiment of the circuit structure according to the invention.

FIG. 1 illustrates the present invention as a series of storage units 11, each storage block consisting of an address decoder 12 and a data storage register 13. The data storage register is enabled by the output signal of the respective address decoder 12. To receive data and addressing information, the storage units 11 are connected to a data bus 14 and an address bus 15 via buffers 39 and 24, respectively. Each storage unit 11 is also connected to a control line 16 which supplies the read/-write signal. Generally, the write signal is simply the inversion of the read signal. The control line 16 also supplies the read/write signal to a delay circuit 20.

A precharge sensor is connected at the extremity of the address bus. The precharge sensor is also connected to the outputs of the address buffer. In this manner, the circuitry uses the precharge sensor to emit a valid address signal whenever the lines on the outputs of the address buffer deviate from the precharge state. In turn, this valid address signal enables the address decoder 12.

Precharge logic 17 is connected to the outputs of address buffer 24 to provide a means for precharging the outputs of the buffer 24 with a precharge address.

The embodiment shown in FIG. 1 includes a flip-flop 19 for controlling the precharge logic 17 and for enabling address buffer 24. The set input of flip-flop 19 is connected to a start-writing signal IS and the reset input is connected to a stop-writing signal FS. The stop writing signal FS is the output of an OR gate 36 with inputs of (1) power-on reset signal I and (2) the output of the delay circuit 20.

The delay circuit 20 is formed by delay address decoder 21 and delay flip-flop 23. In order for the delay circuit to introduce a delay identical to that required to write a datum in a storage register, delay address decoder 21 and delay storage register 23 are identical to the decoders 12 and registers 13 of the actual storage units. The delay circuit 20 is constructed by connecting the output of the precharge sensor 18 to address decoder 21. The address input 22 is permanently tied high to keep the delay storage register permanently selected. The output of the delay address decoder 21 enables the delay flip-flop 23. The reset input of flip-flop 23 is connected to the output of the precharge sensor 18. As previously described, the output of flip-flop 23 represents the logical combination of the two inputs of the OR logic gate 36.

Referring now to FIG. 2, a) represents the change of the data on the data bus; b) represents the change of the address information on the address bus; c) represents the read/write signal; d) represents the start-writing signal; e) is the output of flip-flop 19 and represents the precharge end signal and the consequent enabling of the addresses on the address bus; f) represents the valid address signal emitted by the precharge sensor after the precharge operation has been terminated; g) represents the stop-writing signal; and h) represents a change of the contents of the storage register.

The operation of the present embodiment shown in FIG. 1 shall now be described with reference to the operation of writing a datum in a register. A read operation is similar to a writing operation except that, in the read operation, the circuitry transfers a datum from the register onto the data bus, as opposed to from the data bus to the register.

In order to write a datum in a register 13, the circuitry receives a write signal on line 16 (FIG. 2c). The write operation is necessarily conducted in the time interval ranging between t1 and t2 (FIGS. 2a and 2b): the time between changes in data and address values on the respective buses.

Additionally, the circuitry of the present embodiment receives a start-writing signal IS (FIG. 2d). The IS signal sets flip-flop 19. In turn, the output of flip-flop 19 (FIG. 2e) disables precharge logic 17 and drives address buffer 24. Once driven, address buffer 24 transfers the contents of address bus 15, the address of register 13, to address decoder 12.

The precharge sensor 18 detects an address different from the precharge address and, after a given delay time greater than the stabilization time of the address bus 15, enables the address decoder 12 by producing a valid address signal IV (FIG. 2f). At this point, the address of register 13 is recognized by the invention as valid and is decoded by the address decoders 12.

Simultaneously, the precharge sensor 18 enables the address decoder 21 in the delay circuit 20 and resets the flip-flop 23. The output of the address decoder 21 provides a driving impulse to flip-flop 23. Therefore, after a delay time—equal to that of any register 13—the output of flip-flop 23 is driven to logic level "1."

The output of flip-flop 23, and thus of the dummy delay circuit 20, is combined with the power-on reset signal at input to the OR gate 36. Consequently, the output of OR gate 36 supplies a reset input signal to flip-flop 19 as the stop-writing signal FS (FIG. 2g).

Resetting the flip-flop 19 enables the precharge logic 17 and, as a result, the precharge address is charged on the address bus 15. The precharge sensor 18 detects the precharge state and consequently disables the address decoder 12. However, while the delay circuit produced the stop-signal, the circuitry wrote the datum on the data bus into the contents of the register 13 in the manner illustrated in FIG. 2h. As a result, register 13 is addressed for a minimum, but sufficient, amount of time to ensure proper transfer of the datum.

An alternate embodiment of the invention is shown in FIG. 3. This second embodiment utilizes an additional delay flip-flop 25 as well as an inverter in the delay circuit 20. This additional flip-flop 25 is driven, like flip-flop 23, by address decoder 21. This second flip-flop 25 guarantees that the writing of a logical "0" datum has been completed before the stop writing signal is produced. Flip-flop 23 provides a similar function for the writing of a logical "1." Therefore, in the case where the circuitry requires a different amount of time to write a logical "0" than a logical "1," the circuitry will produce a stop-writing signal only after the longer of the two times.

As described in the first embodiment, the precharge sensor 18 sets flip-flop 23 when it enables address decoder 12. In the second embodiment, the precharge sensor 18, resets flip-flop 25 as well.

The negated output of flip-flop 25 is combined with the output of flip-flop 23 via an AND gate 26. In turn, the output of AND gate 26 is combined with a power-on reset signal I at the input of the OR gate 36. The output of the OR gate 36 is then connected to the reset input of flip-flop 19.

In this second embodiment, the impulse of the stop-writing signal FS takes place only after the time necessary to write (1) a logic level "1" in the flip-flop 23 and (2) a logic level "0" in flip-flop 25. Therefore, the second embodiment guarantees that the stop writing signal will not be initiated until after the datum, the datum being either a logical "0" or a logical "1," has been written to the address register 13. By using this technique, data errors are eliminated in the case where the writing of a logical "0" requires more time than the writing of a logical "1."

Figure 4:
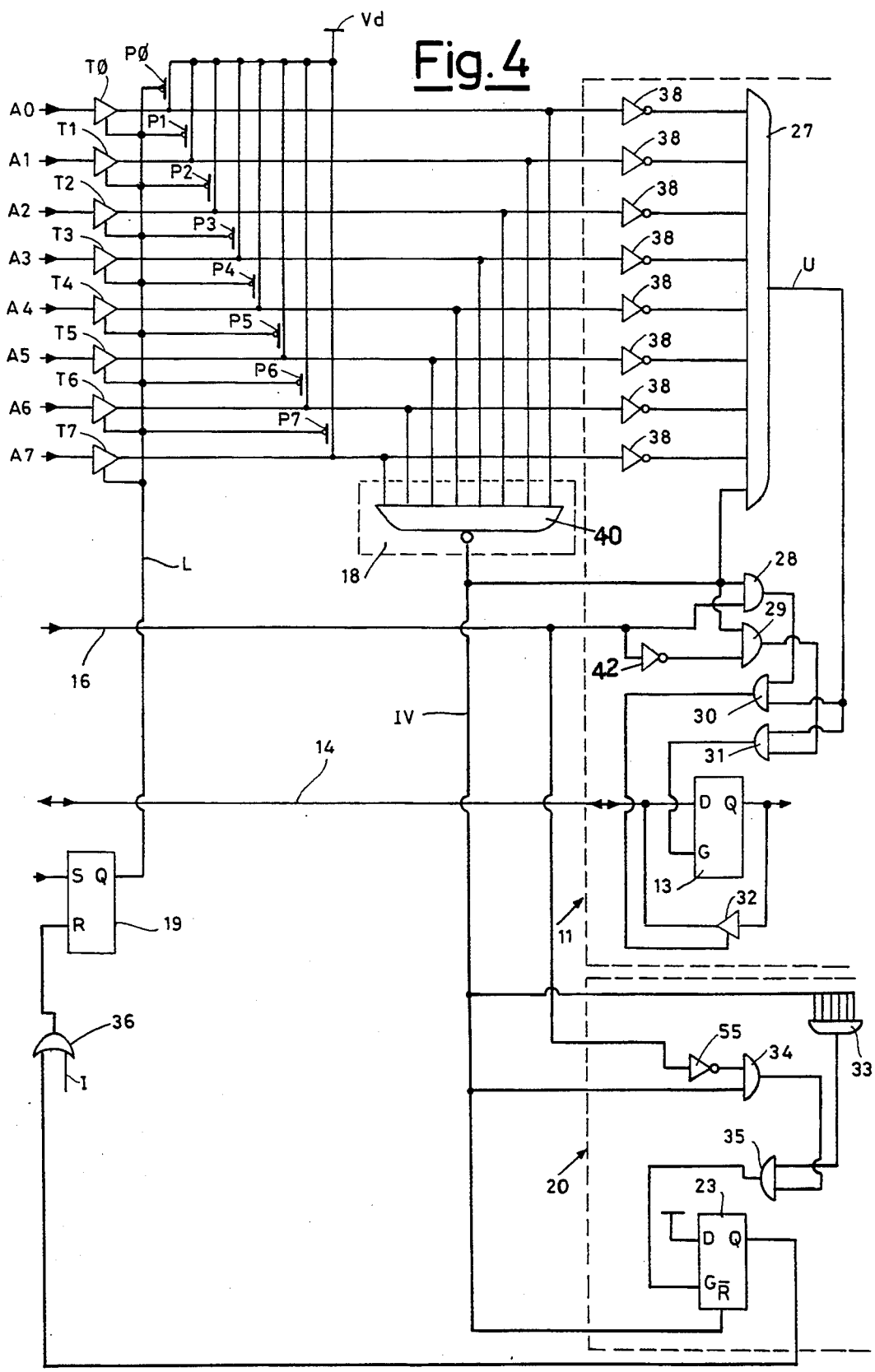
FIG. 4 illustrates in greater detail the circuit structure of the embodiment of FIG. 1.

FIG. 4 illustrates a more detailed version of the circuit structure of the first embodiment. In FIG. 4, lines A0-A7 indicate the inputs of the lines of the address bus 15. Lines T0-T7 are the individual tristate buffers which comprise address buffer 24 of FIGS. 1 and 3. P0-P7 are p-channel MOS transistors having their gates connected to line L, the output of flip-flop 19. This line, as previously described, controls the enabling of the precharge logic and the address buffer 24 (FIG. 2e).

When flip-flop 19 resets line L low, transistors P0-P7 are driven into a conductive state, and the lines of the address bus 15 are held at voltage Vd. This corresponds to the precharge address, i.e., an address consisting of all "1s." However, when flip-flop 19 drives line L high, transistors P0-P7 are turned off and the tristate buffers T0-T7 are sent into conduction. As a result, the buffers transfer the address on the inputs A0-A7 to each storage unit 11.

The input of each storage unit 11 is an AND gate 27. The AND gate 27, has, as inputs, address lines A0-A7. Depending on the actual address of the storage unit 11, a number of the address lines will be inverted before being input to AND gate 27. Additionally, AND gate 27 has the output of the precharge sensor 18, the valid address signal IV, as an input.

The circuitry produces valid address signal IV via NAND gate 40. The inputs to the NAND gate 40 are the address lines A0-A7. The output is the valid address signal IV illustrated in FIG. 2f.

In the present embodiment, the output of the precharge sensor 18 will be at logic level "1" if at least one of the lines of the address bus 15 is at logic level "0." This will guarantee that the circuitry will produce a valid address signal IV at logic level 1 whenever the address on lines A0-A7 is not the precharge address, in this case, all "1s."

The storage unit 11 illustrated in FIG. 4 has an address formed by all logic levels "0." Therefore, all the lines A0-A7 are inverted prior to being input to AND gate 27. In this way, when (1) the address on the address bus 15 coincides with that of the storage unit 11, and (2) the valid address signal IV is at logic level "1", the output U of the AND gate 27 will generate an output of logic level "1."

The circuitry then passes the valid address output IV of NAND gate 40 to AND gate 28 along with the read/write signal of line 16. When a read signal, illustrated in FIG. 4 as active high, is present on line 16, and the valid address signal IV is also active, AND gate 28 will produce an output of logic level "1." The output of AND gate 28 is in turn fed as an input to the AND gate 30. The other signal fed to the input of AND gate 30 is the output U of AND gate 27. Therefore, AND gate 30 generates an output of logic level "1" when the circuitry (1) addresses the storage unit 11, as indicated by a logic "1" output on line U; (2) produces a valid address signal IV at logic level 1; and (3) receives a read request on control line 16. This output initiates the read operation by enabling tristate buffer 32. In turn, the tristate buffer 32 transfers the contents of the storage register onto the data bus 14.

Similarly, AND gate 29 signals the initiation of a write operation. The major difference between the write operation architecture and the read operation architecture is that the write operation architecture negates the signal on read/write line 16, via inverter 42, before sending it as input to its respective AND gate: AND gate 29. The output of AND gate 29 and the output U from AND gate 27 are fed as inputs to AND gate 31. In turn, the output of AND gate 31 generates a driving impulse to transfer the datum on the data bus 14 into register 13.

The delay circuit 20 comprises an AND gate 33 which has a number of inputs equal to the number of lines of the address bus. In this manner, AND gate 33 introduces a delay similar to that produced by AND gate 27. The delay circuit 20 also comprises AND gate 34: having inputs of (1) read/write line 16 for supplying a writing signal (corresponding to the reading signal negated through an inverter 55), and (2) the output of the precharge decoder 18 (specifying the valid address signal IV).

The output of AND gate 34 is in turn fed to the input of an AND gate 35, along with the output of logic gate 33, which is always high and present only to develop a delay. The output of AND gate 35 generates a driving impulse which causes data storage register 23 to write a logical "1." This logical "1" is subsequently fed to OR gate 36. The output of OR gate 36 then resets flip-flop 19 which causes the p-channel MOS transistors to become active. As a result, the outputs of the address buffer 24 are driven high and the system is returned to its precharge state.

The embodiments described above represent significant improvements over the prior art in that they do not require a knowledge of the delays intrinsic to the components used. Moreover, the embodiments operate reliably under all conditions of temperature, power supply, and scale of production. Furthermore, they may be used with either synchronous or asynchronous systems.

We claim:

1. A circuit structure comprising:
   a series of storage units each including an address decoder and a data storage register;
   a data bus;
   an address bus;
   a line for a reading/writing signal;
   a line for a start reading/writing signal:
   a precharge logic suitable for precharging the address bus with a precharge address:
   a precharge sensor having an output suitable for enabling the operation of the address decoder of all the storage units with a given delay with respect to the end of the precharge;
   a flip-flop for controlling the address bus and the precharge logic, the flip-flop being set by the starter-reading/writing signal and reset by a stop-reading/writing signal; and
   a delay circuit activated by the reading/writing signal and enabled by the precharge sensor to produce the stop-reading/writing signal with a delay calculated on the basis of a time necessary to write a datum in a data storage register of said storage units.

2. A circuit structure of claim 1, further comprising:
   a delay circuit storage unit identical to one of the data storage units as a component of the delay circuit.

3. A circuit structure comprising:
   a series of storage units each including an address decoder and a data storage register:
   a data bus;
   an address bus;
   a line for a reading/writing signal;
   a line for a start reading/writing signal;
   a precharge logic suitable for precharging the address bus with a precharge address;
   a precharge sensor having an output suitable for enabling the operation of the address decoder of all the storage units with a given delay with respect to the end of the precharge;
   a flip-flop for controlling the address bus and the precharge logic, the flip-flop being set by the start-reading/writing signal and reset by a stop-reading/writing signal; and
   a delay circuit activated by the reading/writing signal and enabled by the precharge sensor to produce the stop-reading/writing signal with a delay calculated on the basis of a time necessary to write a datum to a data storage register of said storage units, said delay circuit including a delay circuit storage unit functionally identical to one of the data storage units as a component of the delay circuit, the delay circuit storage unit including,
   a delay circuit address decoder functionally identical to one of the address decoders of the data storage unit as a component of the delay circuit, having an enabling input connected to the output of the precharge sensor and an always-active address input, and
   a delay, data storage register functionally identical to the storage registers of the data storage units, having an input connected to the output of the delay circuit address decoder and a reset input connected to the output of the precharge sensor, so that the stop-reading/writing signal is produced with a delay equal to the time necessary for writing a logic level "1" in the delay data storage register.

4. A circuit structure comprising:
   a plurality of storage units each including an address decoder and a data storage device;
   a data bus;
   an address bus;
   a line for a reading/writing signal;
   a line for a start reading/writing signal:
   a precharge logic suitable for precharging the address bus with a precharge address;
   a precharge sensor having an output suitable for enabling the operation of the address decoder of all the storage units with a given delay with respect to the end of the precharge;
   a flip-flop for controlling the address bus and the precharge logic, the flip-flop being set by the start-reading/writing signal and reset by a stop-reading/writing signal; and
   a delay circuit activated by the reading/writing signal and enabled by the precharge sensor to produce the stop-reading/writing signal with a delay calculated on the basis of a time necessary to write a datum to a data storage register of said storage units, said delay circuit including a delay circuit storage unit functionally identical to one of the data storage units as a component of the delay circuit, the delay circuit storage unit including,
   a delay circuit address decoder functionally identical to one of the address decoders of the data storage unit as a component of the delay circuit, having an enabling input connected to the output of the precharge sensor and an always-active address input,
   a delay data storage register functionally identical to the storage registers of the data storage units, having an input connected to the output of the delay circuit address decoder and a reset input connected to the output of the precharge sensor so that the stop-reading/writing signal is produced with a delay equal to the time necessary for writing logic level "1" in the delay data storage register; and
   a second delay data storage register functionally identical to the storage registers of the data storage units, having an input connected to the output of the delay circuit address decoder and a set input connected to the output of the precharge sensor so that the stop,reading/writing signal is produced with a delay equal to the time necessary for writing logic level "0" in said second delay data storage register.

5. A circuit structure comprising:
   a plurality of storage units;
   a data bus connected to said storage units by which data is carried to and from said storage units;
   an address bus connected to said storage units;

a memory access control circuit connected to the storage units;

a line for a start-reading/writing signal connected to said memory access control circuit to permit access to said storage units for reading or writing data to or from said storage units;

a delay circuit activated responsive to said start-reading/writing signal, said delay circuit having functionally similar structure as that structure of one of the said storage units, the delay circuit generating a stop-reading/writing signal after a time delay, that is based on a time necessary to read or write a datum from or to a storage unit as determined by the functionally similar structure within the storage unit; and a line for said stop-reading/writing signal output by said delay circuit and connected to said memory access control circuit to prevent access to said storage units after said time delay.

6. A circuit structure of claim 5 further comprising a precharge logic connected between said memory access control circuit and said address bus, by which said address bus is precharged with a precharge address; and a precharge sensor connected between said address bus and said storage units, by which the operation of said storage units is enabled.

7. A circuit structure of claim 5 wherein said delay circuit includes a flip-flop.

8. A circuit structure of claim 5, further comprising an address buffer connected to said address line and to said memory access control circuit by which an address is outputted onto said address line; and said address buffer is controlled by said memory access control circuit.

9. A circuit structure of claim 5 wherein said storage units each comprise an address decoder and a data storage register.

10. A circuit structure of claim 9 wherein said delay circuit comprises a delay circuit storage unit functionally identical to one of said data storage units, said delay circuit storage unit comprising a delay circuit address decoder functionally identical to an address decoder of said data storage unit, said delay circuit address decoder having an enabling input connected to the output of said precharge sensor and an always-active address input; and a delay storage register functionally identical to a data storage register of said data storage unit.

11. A circuit structure of claim 10 wherein said delay storage register has an input connected to the output of said delay circuit address decoder and a reset input connected to the output of said precharge sensor by which said stop-reading/writing signal is produced with a delay equal to the time necessary for writing a logic level "1" in said delay storage register.

12. A circuit structure of claim 11, further comprising a second delay storage register, said second delay storage register having an input connected to the output of said delay circuit address decoder and a set input connected to the output of said precharge sensor by which said stop reading/writing signal is produced with a delay equal to the time necessary for writing a logic level "0" in said second delay storage register.

13. A circuit structure of claim 12 wherein said second delay storage register comprises a flip-flop.

14. A method for controlling access to a plurality of data storage units comprising:

enabling access to the data storage units for reading or writing data from or to the storage units under a memory access control circuit;

outputting a signal from the memory access control circuit to enable reading from or writing to the storage units upon the memory access control circuit receiving a start-reading/writing signal;

providing said memory access signal to a delay circuit storage unit;

outputting a stop-reading/writing signal from a delay circuit storage unit a selected time after said delay circuit storage unit receives said memory access signal, the delay circuit being structurally similar to the data storage unit, the selected time being based on the amount of time necessary to write data to or read data from a storage unit;

outputting an access termination signal from the memory access control circuit to terminate access to the storage units after receiving said stop-reading/writing signal.

15. A method of claim 14, further comprising:
precharging a precharge address onto an address bus provided for said storage units with a signal outputted from a precharge logic.

16. A method of claim 15, further comprising:
enabling said precharge logic with said memory access termination signal; and disabling said precharge logic with said memory access signal.

17. A method of claim 14, further comprising:
enabling said storage units with a signal outputted form a precharge sensor.

18. A method of claim 17, further comprising:
enabling said delay circuit storage unit with said signal outputted from said precharge sensor.

* * * * *

UNITED STATES PATENT AND TRADEMARK OFFICE
CERTIFICATE OF CORRECTION

PATENT NO. : 5,408,436
DATED : April 18, 1995
INVENTOR(S) : Moloney et al.

It is certified that error appears in the above-indentified patent and that said Letters Patent is hereby corrected as shown below:

In column 7, claim 1, lines 30 to 31, please delete "starter-reading/writing" and insert therefor --start-reading/writing--.

In column 8, claim 3, line 7, after "delay" and before "data" please delete --,--.

In column 8, claim 4, line 60, please delete "stop,reading/writing" and insert therefor --stop-reading/writing--.

Signed and Sealed this

Twenty-sixth Day of December, 1995

Attest:

BRUCE LEHMAN

*Attesting Officer*  *Commissioner of Patents and Trademarks*